(12) United States Patent
Black et al.

(10) Patent No.: US 11,228,289 B1
(45) Date of Patent: Jan. 18, 2022

(54) AMPLIFIERS

(71) Applicant: Cirrus Logic International Semiconductor Ltd., Edinburgh (GB)

(72) Inventors: Angus Black, Edinburgh (GB); Hemant Shukla, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/000,852

(22) Filed: Aug. 24, 2020

(51) Int. Cl.
   *H03F 3/217* (2006.01)
   *H03G 3/30* (2006.01)
   *H04R 3/00* (2006.01)

(52) U.S. Cl.
   CPC .......... *H03F 3/217* (2013.01); *H03G 3/3005* (2013.01); *H04R 3/00* (2013.01); *H03F 2200/03* (2013.01); *H03F 2200/165* (2013.01); *H03F 2200/375* (2013.01); *H03G 2201/103* (2013.01)

(58) Field of Classification Search
   CPC ................ H03F 3/217; H03F 2200/03; H03F 2200/165; H03F 2200/375; H03G 3/3005; H03G 2201/103; H04R 3/00
   See application file for complete search history.

(56) References Cited

U.S. PATENT DOCUMENTS

| | | | | |
|---|---|---|---|---|
| 6,316,992 | B1 * | 11/2001 | Miao | H03F 3/217 330/2 |
| 2003/0148749 | A1 * | 8/2003 | Saito | H03F 3/45977 455/299 |
| 2004/0227567 | A1 * | 11/2004 | Llewellyn | H03F 3/2173 330/9 |
| 2008/0075301 | A1 * | 3/2008 | Watanabe | H03G 3/344 381/94.5 |
| 2008/0079486 | A1 * | 4/2008 | Higuchi | H03F 3/217 330/10 |
| 2008/0161953 | A1 * | 7/2008 | Takagishi | H03F 3/2173 700/94 |
| 2008/0258831 | A1 * | 10/2008 | Kunihiro | H03F 1/0227 332/103 |

(Continued)

FOREIGN PATENT DOCUMENTS

EP   2802074 A1   11/2014

OTHER PUBLICATIONS

Combined Search and Examination Report under Sections 17 and 18(3), UKIPO, Application No. GB2107656.7, dated Oct. 14, 2021.

*Primary Examiner* — David L Ton
(74) *Attorney, Agent, or Firm* — Jackson Walker L.L.P.

(57) ABSTRACT

This application describes an amplifier circuit (200) with a forward signal path with a class-D output stage (102) for generating a driving signal (Sout) based on a digital input signal (Sin). The amplifier has a first feedback path for providing a first digital feedback signal (Sfb1) based on the driving signal and a second feedback path for providing a second digital feedback signal (Sfb2) from a digital part of the forward signal path. The digital input signal (Sin) is combined with a selected feedback signal (Sfbs). The amplifier circuit is selectively operable in a first mode, in which the first feedback signal is used as the selected feedback signal, and in a second mode, in which the second feedback signal is used as the selected feedback signal. A calibration module (204) is operable to calibrate the first feedback path to reduce any DC offset when the amplifier circuit is operating in the second mode.

19 Claims, 2 Drawing Sheets

(56) References Cited

U.S. PATENT DOCUMENTS

| | | | | |
|---|---|---|---|---|
| 2011/0006938 A1* | 1/2011 | Ihs | ............... | H03M 3/344 |
| | | | | 341/143 |
| 2011/0012674 A1* | 1/2011 | Midya | ............... | H03F 3/217 |
| | | | | 330/10 |
| 2011/0116653 A1 | 5/2011 | Schuurmans | | |
| 2013/0127531 A1* | 5/2013 | Lesso | ............... | H03F 3/217 |
| | | | | 330/251 |
| 2015/0180430 A1* | 6/2015 | Wang | ............... | H03F 3/217 |
| | | | | 381/120 |
| 2018/0351515 A1* | 12/2018 | Lesso | ............... | H03F 1/0205 |
| 2018/0351516 A1* | 12/2018 | Lesso | ............... | H03F 3/181 |
| 2019/0081621 A1* | 3/2019 | Schinkel | ............... | H03K 7/08 |
| 2021/0104984 A1* | 4/2021 | Lesso | ............... | H03F 1/3223 |

\* cited by examiner

AMPLIFIERS

TECHNICAL FIELD

The field of representative embodiments of this disclosure relates to methods, apparatus and/or implementations concerning or relating to amplifiers, in particular to class-D amplifiers and operation thereof.

BACKGROUND

Class-D amplifiers are usefully employed in a range of different applications, for example for driving a load transducer, which could be an audio transducer, such as a speaker, or some other transducer, e.g. a linear resonant actuator for generating haptic signals.

As mixed-signal design moves to smaller process node sizes, which may be selected to enable digital processing features and minimize area, conventional analogue circuits do not scale well. Analogue amplifier components can thus have a large impact on the area and power of the circuitry. Digital circuitry scales with process node, making a digital Class D architecture attractive and allowing the design to benefit from the programmability and adaptability of a digital implementation. A class-D amplifier with a digital modulator can thus be advantageously used in a variety of applications.

FIG. 1 illustrates one example of a class-D amplifier circuit 100. The amplifier circuit 100 receives an input signal Sin, which, as noted may be an input digital signal, and outputs an output signal Sout which may be a driving voltage. A modulator 101, for instance a PWM modulator, receives a signal derived from the input signal and generates a suitable modulator output, e.g. PWM signal, to drive an output stage 102. The output stage comprises a plurality of switches for selectively connecting an output node of the output stage 102 to one of a plurality of defined voltages, e.g. a positive supply voltage and ground, or positive and negative supply voltages. The output node thus varies between these voltage levels, with a duty cycle that is controlled by the PWM signal output, such that the average voltage of the output signal Sout depends on the value of the digital input signal Sin. The output signal Sout may be supplied to a load (not illustrated), for instance to drive an output transducer such as a loudspeaker. The output signal Sout may be filtered at least partly by the load and/or by an output filter (not illustrated). In this example, FIG. 1 illustrates a half-bridge output stage 102 for outputting the output signal Sout to the load, but it will be appreciated that a class D amplifier may be implemented with a full-bridge output stage.

Whilst such a class D circuit could be operated in an open-loop mode, analogue effects within the amplifier circuit can result in distortion. For instance, output stage transistor on-resistance, finite rise and fall times, propagation delays and power supply ripples may result in distortion in the output signal Sout. Typically, therefore, the class D circuit is operable in a closed-loop mode of operation that uses negative feedback to suppress such distortion. The class D amplifier circuit 100 thus also includes a feedback path with an analogue-to-digital converter (ADC) 103 for receiving a feedback signal tapped from the output and converting it to digital.

The digital feedback signal Sfb is typically combined with a version of the input signal Sin and filtered by a loop filter 104. In the example illustrated in FIG. 1, the digital feedback signal is subtracted from the input signal Sin and then filtered by the loop filter 104, which may comprise as an integrator for example. It will be understood that other arrangements for filtering and combination of the feedback signal with the input signal may be implemented in other examples.

Whilst the closed loop operation can help suppress distortion in the output as described above, an issue can arise with respect to an DC offset in the feedback path, for instance due to the analogue components of the feedback path.

FIG. 1 illustrates that the feedback path may comprise an analogue front-end (AFE) 105 for receiving and conditioning the output signal for conversion to digital. It will be noted that the AFE 105 is illustrated as separate to the ADC 103 for the purposes of explanation, but at least part of the AFE may comprise an input stage of the ADC.

Any DC offset introduced by such analogue or mixed-signal components, illustrated in FIG. 1 as an injected offset OFS, will be transposed to the output signal Sout, and hence to the load. Such DC offset at the load can be disadvantageous.

SUMMARY

Embodiments of the present disclosure relate to improved class-D amplifier arrangements and methods of amplification. Embodiments may, in particular, relate to a class-D amplifier arrangement operable in a closed-loop mode of operation that at least mitigates the issue of offset in the feedback path.

According to an aspect of the disclosure there is provided an amplifier circuit comprising:

- a forward signal path for receiving a digital input signal and outputting a driving signal, the forward signal path comprising a class-D output stage configured to generate to generate the driving signal based on the input signal;
- a first feedback path for providing a digital first feedback signal based on the driving signal; and
- a second feedback path for providing a digital second feedback signal from a digital part of the forward signal path; and
- a combiner for combining the digital input signal with a selected feedback signal,
- wherein the amplifier circuit is selectively operable in a first mode in which the first feedback signal is used as the selected feedback signal and in a second mode in which the second feedback signal is used as the selected feedback signal; and
- the amplifier circuit further comprises a calibration module operable to calibrate the first feedback path to reduce any DC offset in the first feedback path when the amplifier circuit is operating in the second mode.

In some examples the amplifier circuit may further comprise a controller for controlling the amplifier circuit to operate in said first mode or second mode. The controller may be configured to transition between the first and second modes over a transition period during which both the first and the second feedback signals contribute to the selected feedback signal and the contribution of one of the first and second feedback signals is increased whilst the contribution of the other one of the first and second feedback signals is increased. The controller may be configured to control the transition such that a rate of change of relative contribution of the first and second feedback signals is greater during a middle part of the transition period that at a start or end of the transition period. In some examples, the first and second feedback paths may each comprise respective first and second variable gain elements and the controller may be configured to control the variable gain applied by the first and second variable gain elements. The first and second feedback signals may be combined to provide the selected feedback signal.

In some examples the calibration module may operable, when the amplifier circuit is operating in the second, to: apply a reference signal to the first feedback path; monitor a signal level of the first feedback path; and adjust at least one operating parameter of a component of the first feedback path and/or adjust an amount of a compensation signal applied to the first feedback path so as to reduce any variation between the monitored signal level and a target signal level. The reference signal may correspond to a zero-level signal. In some examples, the calibration module may be configured to apply the reference signal to the first feedback path by connecting an input to the first feedback path to a defined reference voltage whilst disconnected from the forward signal path. In some examples, the calibration module may be configured to apply the reference signal to first feedback path via the forward signal path.

The amplifier circuit may be configured to operate in a start-up sequence comprising:
a first period in which the amplifier circuit operates in the second mode and the calibration module is active to calibrate the first feedback path;
a second period in which the amplifier circuit operates in the first mode;
a third period in which the amplifier circuit operates in the second mode and the calibration module is active to calibrate the first feedback path for any variation in offset that occurred during the second period; and
a fourth period in in which the amplifier circuit operates in the first mode to generate a time-varying driving signal based on the input signal.

In some examples the amplifier circuit may be configured to be selectively operable, in use, to generate a time-varying driving signal based on the input signal in said first mode or in an alternative driving mode, in which the first feedback signal does not contribute to a signal in the forward signal path. In some examples, the alternative driving mode may be the second mode. In some examples, the alternative driving mode may be an open-loop mode in which no feedback is applied to the forward signal path. The amplifier circuit may be configured to selectively operate to generate the time-varying driving signal in said first mode or the alternative driving mode based on at least one of: an indication of driving signal amplitude; and a specified performance condition.

The amplifier circuit may be an audio amplifier circuit for driving an audio output transducer. The amplifier circuit may be implemented as an integrated circuit.

Aspects also relate to an electronic device comprising the amplifier circuit of any of the embodiments described herein.

In a further aspect there is provided an amplifier circuit comprising:
a forward signal path for receiving a digital input signal and outputting a driving signal, the forward signal path comprising a class-D output stage configured to generate to generate the driving signal based on the input signal;
a first feedback path for providing a digital first feedback signal based on the driving signal; and
a second feedback path for providing a digital second feedback signal from a digital part of the forward signal path;

wherein the amplifier circuit is selectively operable in a first mode in which feedback is applied to the forward signal path based on the first feedback signal and in a second mode in which feedback is applied to the forward signal path based on the second feedback signal.

In a further aspect there is provided a class-D amplifier for generating an output driving signal based on a digital input signal combined with a feedback signal, wherein the class-D amplifier is selectively operable in:
a driving mode in which a first feedback path is active to provide the feedback signal from the output driving signal; and
a calibration mode in which the feedback signal is derived from a digital part of a forward signal path of the amplifier and a calibration is applied to the first feedback path to reduce any DC offset in the first feedback path.

Unless expressly indicated to the contrary, any of the various features of the various implementations discussed herein may be implemented together with any one or more of the other described features in any and all suitable combinations.

BRIEF DESCRIPTION OF DRAWINGS

For a better understanding of examples of the present disclosure, and to show more clearly how the examples may be carried into effect, reference will now be made, by way of example only, to the following drawings in which.

DETAILED DESCRIPTION OF EMBODIMENTS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above with respect to FIG. 1, a digital class D-amplifier operable in a closed-loop mode of operation may advantageously be used in a range of applications. However, as also noted above, any DC offset introduced within the feedback path may be transposed to the output, which may be disadvantageous.

Any unwanted DC offset of the feedback path may be, at least partly, compensated for by adjusting the operating parameters of the components, i.e. trimming the device parameters, and/or adding a suitable compensation to an appropriate part of the signal path.

If the DC offset of the feedback path was constant, suitable operating parameters and/or compensation to mitigate for the offset could be determined, e.g. as part of some factory calibration step, and then applied whenever the amplifier is operated in the closed-loop mode of operation.

However, in practice the offset may vary with operating conditions of the amplifier circuit, for example temperature and/or device stress. Therefore, the amount of offset may vary in use. It would therefore be desirable to be able to dynamically compensate for any offset that arises in use.

Embodiments of the present disclosure thus allow for calibration and/or compensation for DC offset of a feedback path of a class-D amplifier.

Embodiments of the present disclosure thus relate to a class D-amplifier operable in first and second modes of operation. The first mode may correspond to a normal closed-loop operating mode, with the feedback signal derived from the output signal Sout, such as described above. In the second mode of operation, however, a feedback signal is generated and combined with the input signal, but the feedback signal is tapped from a digital part of the forward signal path.

In this second mode of operation, the analogue components of the class-D amplifier circuit and, in particular, the analogue or mixed-signal components of the feedback path are not used contribute to feedback signal which is combined with the input signal. Therefore, in the second mode of operation, a calibration or compensation process can be performed for these components without affecting the output signal Sout which is output to the load.

Figure 1:
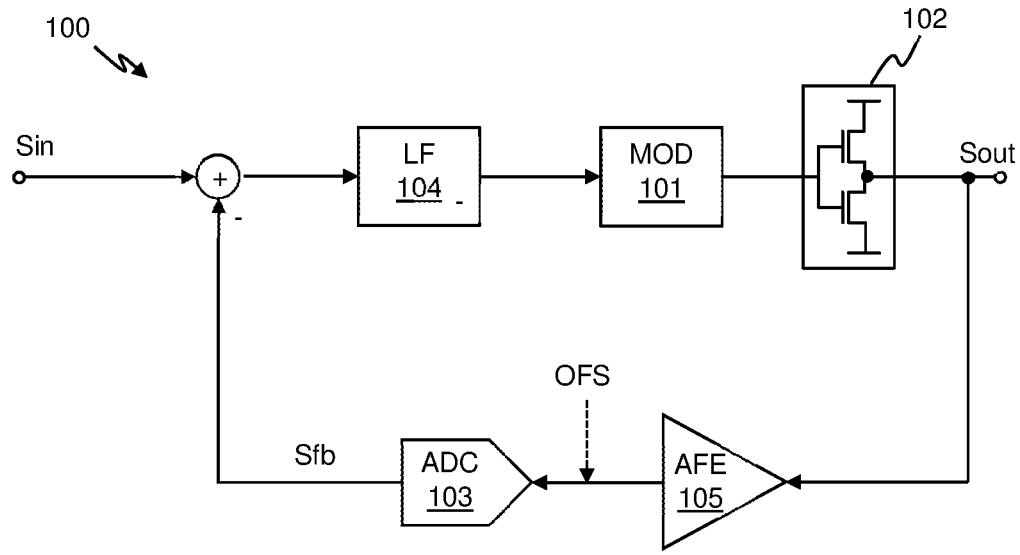
FIG. 1 illustrates one example of a conventional class-D amplifier.
Figure 2:
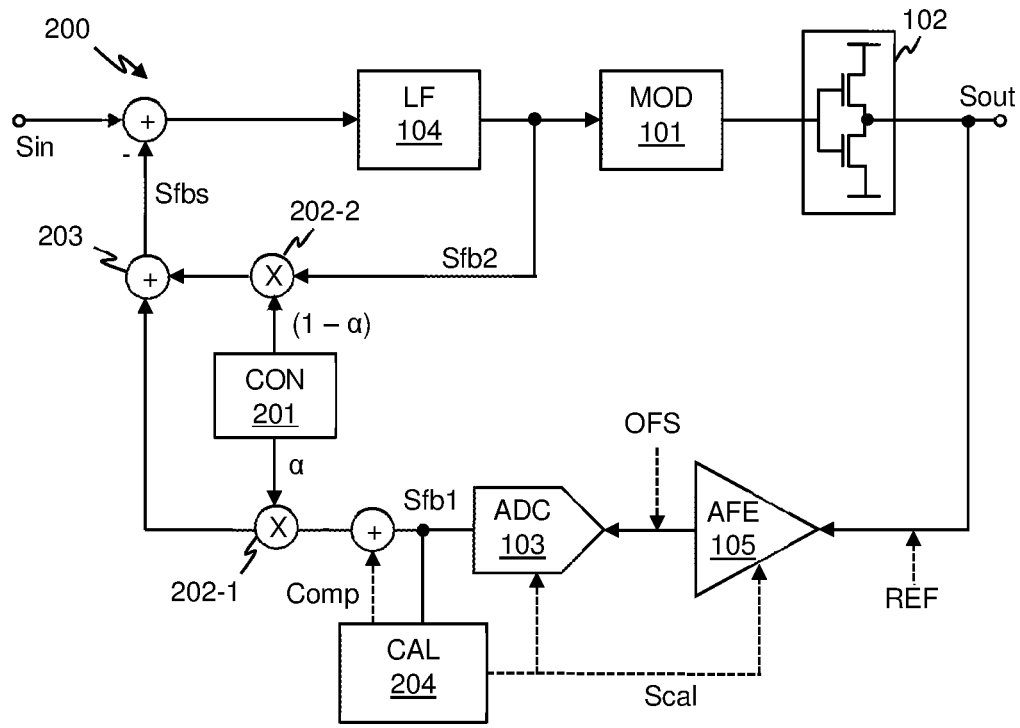
FIG. 2 illustrates an example of a class-D amplifier according to an embodiment.

FIG. 2 illustrates one example of a class-D amplifier circuit 200 according to an embodiment, in which similar components to those discussed with reference to FIG. 1 are identified with the same reference numerals.

As discussed with reference to FIG. 1, the amplifier circuit 200 of FIG. 2 has a modulator 101, e.g. a PWM modulator, to drive the output stage 102 based on the input signal Sin. The input signal Sin is, in this example, combined with a selected feedback signal Sfbs prior to the loop filter 104 to provide the input to the modulator 101. The input signal Sin is a digital input signal, and the loop filter 104 is thus a digital filter and the modulator 101 is operable to receive a digital input.

The amplifier circuit 200 also has a first feedback path including ADC 103 and AFE 105 which are operable to generate a first digital feedback signal sfb1 based on the output signal Sout.

The amplifier circuit 200 of FIG. 2 also includes a second feedback path for providing a second feedback signal Sfb2. The second feedback signal Sfb2 is a digital signal which is derived from a digital part of the forward signal path, in this example from downstream of the loop filter 104.

The amplifier circuit 200 is operable in at least first and second modes of operation to selectively use the first feedback signal Sfb1 or the second feedback signal Sfb2 as the selected feedback signal Sfbs, to be combined with the input signal Sin. In other words, either the first feedback signal Sfb1 or the second feedback signal Sfb2 may be selectively used to close the loop.

In the first mode of operation, the first feedback signal Sfb1 is used as the selected feedback signal Sfbs. In this mode of operation, the selected feedback signal Sfbs thus corresponds to the output signal Sout and the first mode of operation corresponds to a normal closed-loop operating mode that suppresses distortion in the output signal.

In the second mode of operation, the second feedback signal Sfb2 is used as the selected feedback signal. The second feedback signal Sfb is, as mentioned, a digital feedback signal which is derived from a digital part of the forward signal path, which means that the ADC 103 and AFE 105 of the first feedback path are not needed. Thus, in the second mode of operation a calibration or compensation process may be applied, as will be described in more detail below.

In the second mode of operation the amplifier circuit still operates with a closed feedback loop, but the loop is closed around the digital components of the amplifier circuit that do not introduce unwanted DC offset.

The fact that the amplifier operates with a closed feedback loop in the second mode of operation means that the loop filter 104 remains operating in the second mode, and the input to the filter remains with the normal operating range of the filter, i.e. within the input range of the filter as expected in the first mode of operation. The loop filter 104 will thus operate within normal parameters in the first mode and in the second mode and during any transition between modes.

If, in the second mode, there was no feedback at all, i.e. the second mode corresponded to an open-loop mode of operation, the lack of the feedback signal would mean that loop filter 104 would saturate in the second mode, which could lead to transients when subsequently transitioning to the first mode, with the feedback loop closed again.

Thus, maintaining closed-loop loop operation in the second mode can thus avoid issues regarding transients associated with the loop filter, whilst allowing for calibration of the first feedback path, and avoids a need for clearing of the filter and some restart sequence as may otherwise be required when transitioning from the second mode to the first. This is particularly advantageous in examples where the amplifier circuit is configured so as to operate in the first mode whenever operation to drive a load, i.e. the amplifier always operates in the first, closed-loop mode of operation when actually driving a load. For such examples the second mode of operation provides a way to allow for calibration of the first feedback path whilst maintaining the filter within an effective feedback loop. This allows a gradual transition between the modes.

In the example of FIG. 1 the amplifier circuit comprises a controller 201 to control the mode of operation. The controller 201 may be configured to select the first feedback signal or the second feedback signal as required. Advantageously the controller is configured to apply a controlled transition between modes over a period of time, i.e. to not just instantaneously swap between using the different feedback signals.

In operation, the first feedback signal Sfb1 may comprise some unwanted DC offset OFS introduced in the first feedback path, whereas the second feedback signal Sfb2, being derived from the digital part of the circuit, will, in the second mode, be free of such unwanted offset. An instantaneous or very rapid transition between modes may thus result in a step change in the DC offset in the output signal Sout, and hence a step change in the voltage is applied to the load. Such a step change may be undesirable, e.g. for an audio application may result in unwanted audible artefacts such as pops or clicks.

On start-up, the amplifier circuit 200 could be started in the second mode of operation and a calibration process applied to the first feedback path so as to reduce the amount of unwanted offset. At the end of the calibration process the amplifier circuit could swap to the first mode of operation and, if the calibration process was performed correctly, rapid switching between the modes of operation at this point may not result in a significant step change in offset out of the output signal Sout (although the calibration may not remove all the unwanted offset and it may still be beneficial to apply a more gradual transition).

However, as noted above, the amount of unwanted offset in the feedback path may vary in use, in particular with temperature, and in some applications by several tens of millivolts. Therefore, even if an initial calibration were applied, as the amplifier circuit operates in the first mode the offset in the feedback path may vary, which may thus result in a variation in the offset across the load. It may therefore be advantageous to apply a calibration to the first feedback path after a period of operation in the first mode. Swapping to the second mode at this point may thus involve a relatively significant variation in offset applied to the load and hence a gradual transition may be advantageous.

In the example of FIG. 2, the controller 201 is configured to controllably vary the contribution of the first feedback signal Sfb1 and the Sfb2 to the selected feedback signal Sfbs transition over a transition period. Thus, in the first mode, the first feedback signal may contribute all, i.e. 100%, of the selected feedback signal Sfbs. On a transition to the second mode, the relative contribution of the first feedback signal Sfb1 to the selected feedback signal Sfbs may be reduced over a period of time, whilst the contribution of the second feedback signal Sfb2 is correspondingly increased, until the second feedback signal Sfb2 contributes all of the selected feedback signal Sfbs and the amplifier circuit is operating in the second mode.

The circuit of FIG. 2 thus illustrates that digital gain elements 201-1 and 202-2 applies respective digital gains to the first and second feedback signals and that the gain adjusted feedback signals are combined by combiner 203 which thus provides the selected feedback signal Sfbs.

The controller may control the gain applied to the first feedback signal Sfb1 inversely with the gain applied to the second feedback signal Sfb2, for example applying a gain a (in a normalised range of 0 to 1) to the first feedback signal Sfb1 whilst applying a gain of 1-α to the second feedback signal Sfb2. The controller 201 may thus control a to be equal to 1 in the first mode and equal to 0 in the second mode and to transition between the modes via a plurality of intermediate values over time.

Any suitable transition may be implemented, e.g. as a linear ramp which may be continuous or stepwise with small step sizes. In at least some applications however an "s-shaped" transition may be implemented, i.e. with a rate of transition that is greater in the middle than at the start or end of the transition. Such an s-shaped transition avoids sharp transients, which could be present at the start and end of a linear ramp, so may be less likely to cause a disturbance on the load.

As discussed above, when operating in the second mode a calibration process may be applied so as to reduce and/or compensate for any DC offset in the feedback path.

The amplifier circuit 200 illustrated in FIG. 2 thus comprises a calibration module 204 for performing a calibration process. During the calibration process a known reference signal may be applied, which may for instance be a zero-level signal. If a zero-level reference signal were input to the first feedback path, then ideally the signal at any point of the first feedback path should also correspond to a zero-level signal and any variation may be due to unwanted DC offset.

The calibration module 204 may thus monitor the signal at one or more points of the first feedback path in response to the known reference signal being applied, and control one or more parameters of the components of the feedback paths so as to reduce any variation between an output of the first feedback path and an expected value based the reference signal. Conveniently the calibration module 204 may monitor the digital signal Sfb1 output from the ADC 103 to determine the extent of any offset.

The calibration module 204 may compensate for the offset in a number of different ways. In some embodiments the calibration module 204 may adjust one or more operating parameters of components in the first feedback path, i.e. the AFE 105 and/or ADC 103. The calibration module 204 may thus generate one or more calibration control signals to control parameters of the component(s), e.g. supply voltages, biasing, etc. to reduce the mismatch between the monitored signal and the expected or target value. Additionally, or alternatively a compensation may be applied to first feedback path to compensate for the offset. The compensation may conveniently be applied to the digital signal Sfb1.

In some embodiments the reference signal may be applied directly to the first feedback path. Thus, when operating fully in the second mode, the defined reference signal REF may be applied to an input of the first feedback path, e.g. to an input of the AFE 105.

In some cases, the first feedback path may be disconnected from the output stage 102 during application of the reference voltage, i.e. the first feedback path is switched from receiving the output signal Sout to receiving the defined reference REF during the calibration process. After the calibration, the first feedback path could be switched back to receiving the output signal Sout, prior to starting the transition to the first mode of operation.

In some instances, however, if the calibration is being performed at a time when there is no input signal to be amplified, e.g. as part of an initialisation process for the amplifier circuit, the zero-reference signal could be applied as the input signal Sin to the amplifier.

With a zero-reference input signal, the output signal Sout should, ideally, also be a zero-level signal, and hence provide a zero-level input to the first feedback path. In practice, any offset within the feedforward path will appear in the output signal Sout, however the calibration module 204 may still be able to perform a calibration on the components of the feedback path, e.g. the AFE 105 and ADC 103 so as to minimise any offset in the first feedback signal.

As noted, the second mode of operation may thus be used to allow for calibration or compensation of the first feedback path of the amplifier, so as to avoid unwanted offset appearing at the load when operating in the first closed-loop mode of operation.

The controller 201 may thus be configured to operate the amplifier circuit 200 in the second mode at times when calibration of the amplifier circuit is desired. In some implementations controller 201 may be configured to operate in the second mode as part of a start-up routine.

Figure 3:
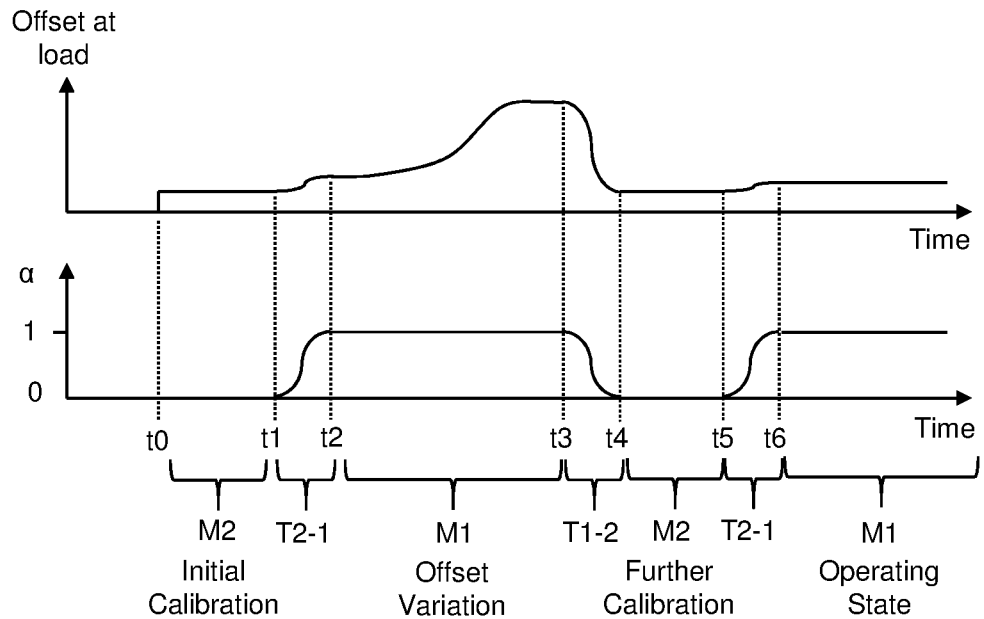
FIG. 3 illustrates example waveforms of a sequence of operation of an amplifier circuit according to an embodiment.

FIG. 3 illustrates one example of how the amplifier circuit may be operated in the different modes to allow calibration on start-up.

FIG. 3 illustrates the offset at the load against time and also the gain setting a controlled by the controller 201 to control the operating mode. FIG. 3 indicates that, initially, the amplifier circuit is inactive. At a time t0 the amplifier circuit is started-up, e.g. powered for operation. The amplifier circuit is started at t0 in the second mode of operation.

In the second mode of operation, the first feedback signal Sfb1 from the first feedback path is not used, and thus no offset from the first feedback path appears at the load. Any offset at the load is thus any inherent offset due to the forward signal path. During this initial period of operation in the second mode, M2, an initial calibration of the amplifier circuit and the first feedback path may be performed.

At a time t1, when the initial calibration is complete, the controller initiates the transition to the first operating mode and thus progressive increases the contribution of the first feedback signal whilst reducing the contribution of the second feedback signal, in this case by increasing the value of a as discussed with respect to FIG. 2. At a time t2 the amplifier circuit is operating in the first mode M1.

During initial operation of the amplifier circuit in the first mode, temperature changes will result in a variation of the offset in the first feedback path, which may increase the offset at the load. After a certain period of operation in the first mode the controller, at a time t3, initiates a transition back to the second mode of operation. The duration of the period of the operation in the first mode, i.e. the period between t2 and t3 may, in some cases, be predefined, but in some embodiments this period may be selectively variable by the controller 201, for instance based on some signal from the calibration module.

Once the amplifier circuit is operating in the second mode again, a further calibration may be performed to calibrate for the temperature dependent offset. Once this further calibration is complete, at a time t5 the controller initiates a transition back to the first mode of operation. At a time t6 the amplifier circuit is operating in the first mode, and the temperature of the amplifier circuit may be relatively stable and may change relatively slowly. The amplifier circuit may thus be in an operating state ready for amplification of an input signal.

In some implementations the controller 201 may be configured to perform additional calibrations in use, and thus may, from time to time, transition to the second mode of operation to allow for a calibration process to be performed. The controller 201 may thus periodically control operation in the second mode of operation so as to allow for further calibration. The intervals between instances of operation in the second mode may be pre-determined and/or based on some operating condition or state. In some embodiments the controller 201 may be responsive to one or more control signals received from some other control module, which may be off chip, as to when to transition between the different modes of operation. In some embodiments the controller 201 itself may be implemented off chip.

Operation in the second mode allows for calibration of the first feedback path, so as to remove or compensate for the effect of DC offset in the first feedback path when subsequently operating in the first mode. This can reduce the DC offset across the load when operating in the first mode.

In some implementations reducing the offset across the load when operating in the first mode may be advantageous as it may allow the amplifier circuit to swap, during normal operation, between the first mode and an alternative driving mode (which may or may not be the second mode) in which the first feedback signal is not contributing to the forward signal path, without a significant change in offset across the load.

As discussed above, operating in the first, closed-loop, mode of operation with negative feedback from the output Sout, can help reduce distortion in the output signal due to analogue effects. However, in this mode of operation the noise performance of the amplifier will depend on the noise performance of the ADC 103. Providing an ADC 103 which provides a desired noise performance, e.g. SNR (signal to noise ratio), even for relatively low level input signals may represent a design challenge and/or require use of components that are relatively large and/or have a relatively high power consumption. Size and/or power consumption are often relatively important factors, especially for portable/battery power devices and generally it may be desirable to minimise circuit areas and/or reduce power consumption.

In some embodiments, the class-D amplifier circuit 200 may thus be configured so that, when operating to generate a driving signal to drive a load, the amplifier circuit may be selectively operated in the first mode, with the ADC 103 active and the first feedback signal Sfb1 contributing to the forward signal path, or in an alternative driving mode in which the first feedback signal Sfb1 does not contribute to the forward signal path. The alternative driving mode may, in some instances, be the second mode described above, but in this case there is not necessarily any calibration of the first feedback path occurring during an instance of the second mode, and the amplifier circuit 200 may be used to generate a time varying, non-zero output signal Sout based on a corresponding input signal. In some instances, the alternative driving mode may be an open-loop mode, where there is no feedback applied to the forward signal path. The controller 201 may implement an open-loop mode by setting the relevant gains for both the first and second feedback signals Sfb1 and Sfb2 to zero.

The relevant mode of operation, i.e. the first mode or the alternative driving mode, may be selected based on an operating condition which could be a desired performance condition, e.g. for quality or power performance. For example, if high-quality is specified, the first feedback path, including the ADC 103, may be enabled to suppress distortion in the output signal. However, if a low power operation is specified, the amplifier circuit could be operated in the alternative driving mode and the ADC 103 disable to save power.

The operating condition could additionally or alternatively be a signal amplitude of the signal being amplified, with the first mode being used for higher signal amplitudes and the alternative driving mode being used for lower signal amplitudes. Distortion is more of an issue at higher signal amplitudes and thus the first mode, with feedback from the output is used when distortion could be an issue. At lower signal amplitudes, distortion is less of an issue, but noise performance of the ADC is more important to maintain a desired SNR. Thus, at lower signal amplitudes the alternative driving mode is used, and thus there is no noise introduced from the ADC. This may relax various design constraints for the ADC and/or save power by only operating the ADC when required.

In such embodiments, the amplifier circuit 200 may switch from the first mode to the alternative driving mode at any time in operation, based on the signal amplitude or a change in required power/performance, and thus any offset of the first feedback path would be an issue for switching between such modes. In embodiments of the present disclosure however operation in the second mode to allow for calibration of the first feedback path, taking into account temperature dependent offset, can avoid problems when switching between driving modes.

Figure 4:
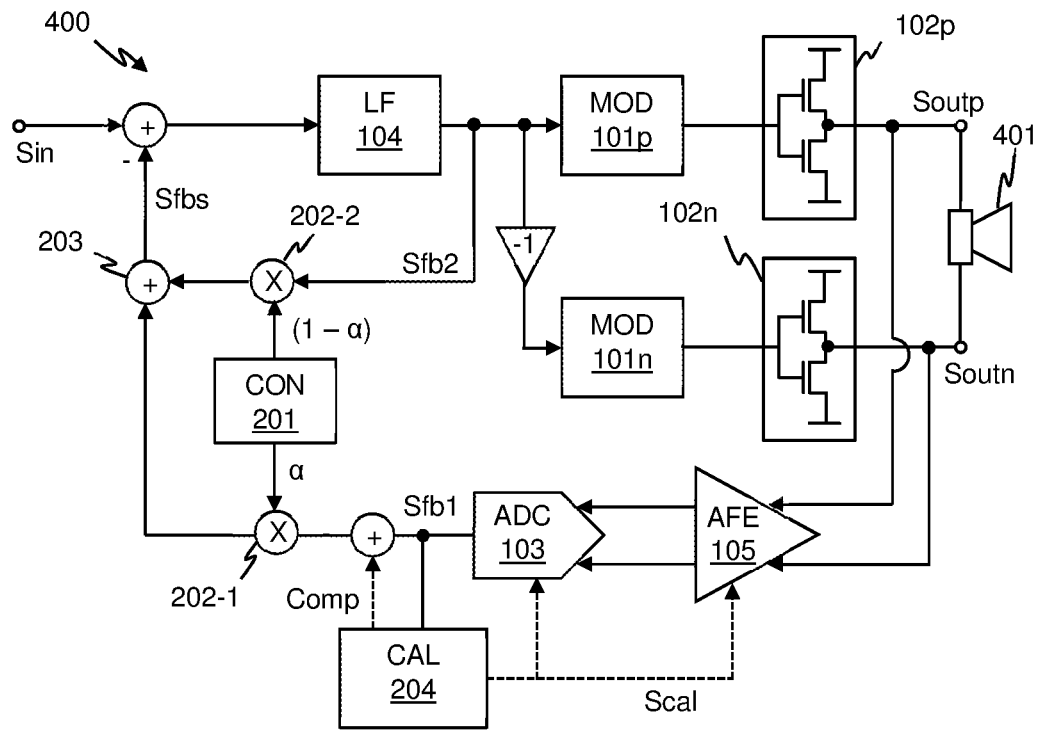
FIG. 4 illustrates an example of a class-D amplifier for driving a bridge-tied-load according to an embodiment.

As noted above the class-D amplifier circuit may be implemented with a half-bridge output stage for driving a load with a single-ended driving signal, or the class-D amplifier could be implemented to drive a load in a bridge-tied-load (BTL) configuration. FIG. 4 illustrates an example of an amplifier circuit 400 for driving a load 401 in a BTL configuration.

FIG. 4 illustrates that the digital input signal may be used to drive respective output stages 102p and 103n to generate complementary driving signal Soutp and Soutn to drive the load. A differential AFE 105 and ADC 103 may be configured to receive the differential outputs to provide the first digital feedback signal Sfb1.

The foregoing description has discussed driving audio output transducers. This may include transducers such as loudspeakers for generating audible sounds, but may also include ultrasonic or other similar transducers and/or haptic transducers. Embodiments also relate to amplifier circuits for driving other types of transducers.

Embodiments may be advantageously implemented as part of audio processing circuitry, e.g. for audio amplifiers for providing audio driving signals to audio output transducers such as loudspeakers, which may be transducers of a host device and/or transducers of an accessory apparatus which may be removably connected to the host device in use.

Embodiments may be arranged as part of an audio and/or signal processing circuit, for instance an audio circuit such as a codec which may be provided in a host device. A circuit according to an embodiment of the present invention may be implemented as an integrated circuit.

Embodiments may be incorporated in a host electronic device, which may for example be a portable device and/or a device operable with battery power. The host device could a device with one or more loudspeaker provided as part of the host device and/or a connector for making a wired connection with a loudspeaker of a removable accessory apparatus that may be removably connected to the host device in use. The host device may include a wireless communication module for receiving input data. The host device could be a communication device such as a mobile telephone or smartphone or similar, a computing device such as notebook, laptop or tablet computing device, a wearable device such as a smartwatch. The host device could alternatively be an accessory device for use with any such communication, computing or wearable device. For instance, the host device could be a headset or earbud or similar The skilled person will recognise that some aspects of the above-described apparatus and methods, may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. An amplifier circuit comprising:
a forward signal path for receiving a digital input signal and outputting a driving signal, the forward signal path comprising a class-D output stage configured to generate to generate the driving signal based on the input signal;
a first feedback path for providing a digital first feedback signal based on the driving signal; and
a second feedback path for providing a digital second feedback signal from a digital part of the forward signal path; and
a combiner for combining the digital input signal with a selected feedback signal,
wherein the amplifier circuit is selectively operable in a first mode in which the first feedback signal is used as the selected feedback signal and in a second mode in which the second feedback signal is used as the selected feedback signal; and
the amplifier circuit further comprises a calibration module operable to calibrate the first feedback path to reduce any DC offset in the first feedback path when the amplifier circuit is operating in the second mode.

2. The amplifier circuit of claim 1 further comprising a controller for controlling the amplifier circuit to operate in said first mode or second mode.

3. The amplifier circuit of claim 2 wherein the controller is configured to transition between the first and second modes over a transition period during which both the first and the second feedback signals contribute to the selected feedback signal and the contribution of one of the first and second feedback signals is increased whilst the contribution of the other one of the first and second feedback signals is increased.

4. The amplifier circuit of claim 3 where the controller is configured to control the transition such that a rate of change of relative contribution of the first and second feedback signals is greater during a middle part of the transition period that at a start or end of the transition period.

5. The amplifier circuit of claim 3 wherein the first and second feedback paths each comprise respective first and second variable gain elements and the controller is configured to control the variable gain applied by the first and second variable gain elements and wherein the first and second feedback signals are combined to provide the selected feedback signal.

6. The amplifier circuit of claim 1 wherein the calibration module is operable, when the amplifier circuit is operating in the second, to:
apply a reference signal to the first feedback path;
monitor a signal level of the first feedback path; and
adjust at least one operating parameter of a component of the first feedback path and/or adjust an amount of a compensation signal applied to the first feedback path so as to reduce any variation between the monitored signal level and a target signal level.

7. The amplifier circuit of claim 6 wherein the reference signal corresponds to a zero-level signal.

8. The amplifier circuit of claim 6 wherein the calibration module is configured to apply the reference signal to the first feedback path by connecting an input to the first feedback path to a defined reference voltage whilst disconnected from the forward signal path.

9. The amplifier circuit of claim 6 wherein the calibration module is configured to apply the reference signal to first feedback path via the forward signal path.

10. The amplifier circuit of claim 1 wherein the amplifier circuit is configured to operate in a start-up sequence comprising:
a first period in which the amplifier circuit operates in the second mode and the calibration module is active to calibrate the first feedback path;
a second period in which the amplifier circuit operates in the first mode;
a third period in which the amplifier circuit operates in the second mode and the calibration module is active to calibrate the first feedback path for any variation in offset that occurred during the second period; and
a fourth period in in which the amplifier circuit operates in the first mode to generate a time-varying driving signal based on the input signal.

11. The amplifier circuit of claim 1 wherein the amplifier circuit is configured to be selectively operable, in use, to generate a time-varying driving signal based on the input signal in said first mode or in an alternative driving mode, in which the first feedback signal does not contribute to a signal in the forward signal path.

12. The amplifier circuit of claim 11 wherein the alternative driving mode is said second mode.

13. The amplifier circuit of claim 11 wherein the alternative driving mode is an open-loop mode in which no feedback is applied to the forward signal path.

14. The amplifier circuit of claim 11 wherein the amplifier circuit is configured to selectively operate to generate the time-varying driving signal in said first mode or the alternative driving mode based on at least one of: an indication of driving signal amplitude; and a specified performance condition.

15. The amplifier circuit of claim 1 wherein the amplifier circuit is an audio amplifier circuit for driving an audio output transducer.

16. The amplifier circuit of claim 1 implemented as an integrated circuit.

17. An electronic device comprising the amplifier circuit of claim 1.

18. An amplifier circuit comprising:
a forward signal path for receiving a digital input signal and outputting a driving signal, the forward signal path comprising a class-D output stage configured to generate the driving signal based on the input signal;
a first feedback path for providing a digital first feedback signal based on the driving signal; and
a second feedback path for providing a digital second feedback signal from a digital part of the forward signal path;
wherein the amplifier circuit is selectively operable in a first mode in which feedback is applied to the forward signal path based on the first feedback signal and in a second mode in which feedback is applied to the forward signal path based on the second feedback signal.

19. A class-D amplifier for generating an output driving signal based on a digital input signal combined with a feedback signal, wherein the class-D amplifier is selectively operable in:
a driving mode in which a first feedback path is active to provide the feedback signal from the output driving signal; and
a calibration mode in which the feedback signal is derived from a digital part of a forward signal path of the amplifier and a calibration is applied to the first feedback path to reduce any DC offset in the first feedback path.

* * * * *

UNITED STATES PATENT AND TRADEMARK OFFICE
CERTIFICATE OF CORRECTION

| | |
|---|---|
| PATENT NO. | : 11,228,289 B1 |
| APPLICATION NO. | : 17/000852 |
| DATED | : January 18, 2022 |
| INVENTOR(S) | : Black et al. |

It is certified that error appears in the above-identified patent and that said Letters Patent is hereby corrected as shown below:

In the Specification

1. In Column 2, Line 13, delete "to" and insert -- from --, therefor.

2. In Column 2, Line 34-35, delete "to generate to generate" and insert -- to generate --, therefor.

3. In Column 2, Line 38, delete "signal; and" and insert -- signal; --, therefor.

4. In Column 2, Line 65, delete "that" and insert -- than --, therefor.

5. In Column 3, Line 33, delete "in in" and insert -- in --, therefor.

6. In Column 3, Lines 60-61, delete "to generate to generate" and insert -- to generate --, therefor.

7. In Column 5, Line 22, delete "used" and insert -- used to --, therefor.

8. In Column 6, Line 11, delete "with" and insert -- within --, therefor.

9. In Column 6, Line 31, delete "operation" and insert -- operating --, therefor.

10. In Column 7, Lines 27-28, delete "digital gain elements 201-1 and 202-2" and insert -- digital gain elements 202-1 and 202-2 --, therefor.

11. In Column 7, Line 37, delete "a" and insert -- $\alpha$ --, therefor.

12. In Column 11, Line 25, delete "a" and insert -- be a --, therefor.

In the Claims

13. In Column 13, Line 9, in Claim 1, delete "to generate the" and insert -- the --, therefor.

Signed and Sealed this
Twenty-ninth Day of August, 2023

Katherine Kelly Vidal
*Director of the United States Patent and Trademark Office*

14. In Column 13, Line 12, in Claim 1, delete "signal; and" and insert -- signal; --, therefor.

15. In Column 13, Line 43, in Claim 4, delete "that" and insert -- than --, therefor.

16. In Column 14, Line 16, in Claim 10, delete "in in" and insert -- in --, therefor.